(12) United States Patent
Yamada

(10) Patent No.: US 9,496,625 B2
(45) Date of Patent: Nov. 15, 2016

(54) TERMINAL CONNECTION STRUCTURE WITH ELEVATED TERMINALS

(71) Applicant: NHK SPRING CO., LTD., Yokohama-shi, Kanagawa (JP)

(72) Inventor: Yukie Yamada, Kanagawa (JP)

(73) Assignee: NHK SPRING CO., LTD., Kanagawa (JP)

( * ) Notice: Subject to any disclaimer, the term of this patent is extended or adjusted under 35 U.S.C. 154(b) by 0 days.

(21) Appl. No.: 14/701,925

(22) Filed: May 1, 2015

(65) Prior Publication Data

US 2015/0340771 A1    Nov. 26, 2015

(30) Foreign Application Priority Data

May 21, 2014    (JP) ................ 2014-105642

(51) Int. Cl.
| | | |
|---|---|---|
| H01R 4/04 | (2006.01) | |
| H05K 1/02 | (2006.01) | |
| G11B 5/48 | (2006.01) | |
| H01R 4/70 | (2006.01) | |

(52) U.S. Cl.
CPC ............. *H01R 4/04* (2013.01); *G11B 5/486* (2013.01); *H01R 4/70* (2013.01); *H05K 1/0296* (2013.01); *H05K 2201/10522* (2013.01)

(58) Field of Classification Search
CPC .......... H01R 4/04; H01R 4/70; H05K 1/0296; H05K 2201/10522; G11B 5/486
USPC ....... 174/250, 251, 254, 255, 261, 267, 268, 174/117 F, 117 FF; 361/760, 767, 807
See application file for complete search history.

(56) References Cited

U.S. PATENT DOCUMENTS

| | | | |
|---|---|---|---|
| 6,703,566 B1 | 3/2004 | Shiraishi et al. | |
| 7,359,215 B2 * | 4/2008 | Ochiai | G09G 3/3233 174/254 |
| 2004/0144563 A1 | 7/2004 | Shiraishi et al. | |
| 2005/0068682 A1 * | 3/2005 | Sasaki | G11B 5/486 360/264.7 |
| 2006/0034018 A1 | 2/2006 | Deguchi et al. | |
| 2007/0137026 A1 | 6/2007 | Kubota et al. | |

FOREIGN PATENT DOCUMENTS

| | | |
|---|---|---|
| JP | 10-256688 | 9/1998 |
| JP | 2006-049751 | 2/2006 |
| JP | 2007-026654 | 2/2007 |
| JP | 2007-173362 | 7/2007 |
| JP | 2012-150872 | 8/2012 |
| JP | 2012-156371 | 8/2012 |

\* cited by examiner

*Primary Examiner* — Hoa C Nguyen
*Assistant Examiner* — Amol Patel
(74) *Attorney, Agent, or Firm* — Norris, McLaughlin & Marcus, P.A.

(57) ABSTRACT

A terminal connection structure includes a first connection and a second connection connected to each other through an anisotropic conductive film. At least one of the first and second connections comprises terminals arranged side by side at an end of a wiring pattern formed between base and cover insulating layers to expose outside the cover insulating layer, and a support portion protruding relative to a part of the base insulating layer in a surrounding area of a respective one of the terminals.

6 Claims, 5 Drawing Sheets

TERMINAL CONNECTION STRUCTURE WITH ELEVATED TERMINALS

BACKGROUND OF THE INVENTION

1. Field of the Invention

The present invention relates to a terminal connection structure used for, for example, conductively connecting a tail connection of wiring of a head suspension to a main flexible wiring board.

2. Description of the Related Art

A hard disk drive (HDD) has a hard disk and a magnetic head supported with a head suspension. The magnetic head is electrically connected through wiring of the head suspension to a main flexible wiring board on a main body of the HDD.

Between the wiring of the bead suspension and the main flexible wiring board on the main body of the HDD, a tail connection and a board side connection are formed for the wiring of the head suspension and the main flexible wiring board, respectively. The tail connection and the board side connection include terminals that are connected to each other by ultrasonic bonding, soldering, or adhering with the use of an anisotropic conductive film (ACF) as disclosed in JP10-256688A, JP2006-049751A, JP2007-173362A, JF2012-150872A, and JP2012-156371.

Recently, it is required for HDDs higher recording density and higher reliability. For this, additional functions may be incorporated into a magnetic head based on components such as a heater for controlling a flying height and a head disk interlace (HDI) sensor other than usual read/write elements. Further additional functions such as energy assisted recording are considered to be incorporated into the magnetic head. Accordingly, many magnetic heads have ten or more terminals including the terminals for the functions as well as the ground terminal.

According to the number of the terminals of the magnetic head, the number of wiring traces of the head suspension and terminals of the tail connection becomes ten or more. In a downsized HDD, the tail connection has a limit on the size thereof to inevitably involve downsizing and/or densification of the terminals. Many products, therefore, employ the connection with the use of the ACF in view of a risk of a short circuit and a workability as disclosed in JP 2012-150872.

FIGS. 11A to 12B illustrate terminal connection structures in which each one is applied to a tail portion of wiring of a head suspension to connect a tail connection 101 of the head suspension to a board side connection 103 of a main flexible wiring board on a main body of a HDD. FIGS. 11A and 12A are plan views partly illustrating the terminal connection structure with absence of the board side connection 103. FIG. 11B is a sectional view taken along a line XIB-XIB of FIG. 11A with the board side connection 103 represented with a chain double-dashed line. FIG. 12B is a sectional view taken along a line XIIB-XIIB of FIG. 12A with the board side connection 103 represented with a chain double-dashed line.

The tail connection 101 is configured that a wiring pattern 111 is laminated on a flat base insulating layer 107 and a cover insulating layer 109 covers the wiring pattern 111. A plurality of terminals 105 are arranged side by side at an end of the wiring pattern 111 to expose outside the cover insulating layer 109.

To the tail connection 101, the board side connection 103 is conductively connected through an ACF 113.

Around the terminals 105, parts of the cover insulating layer 109 are arranged on and protrude from surfaces of the terminals 105, respectively. The ACF 113 has a certain amount of flexibility and surely contacts with the surface of the terminals 105 if the number of the terminals 105 are relatively small as illustrated in FIGS. 11A and 11B. In this case, a sufficient degree of contact is secured between the surfaces of the terminal 105 and the ACF 113, and the protrusion of the cover insulating layer 109 has an insignificant effect on the electric connection.

If, however, the number of the terminals 105 are relatively large to cause the higher terminal density than the case of FIGS. 11A and 11B as illustrated in FIGS. 12A and 12B, the protrusion of the cover insulating layer 109 reduces the degree of contact between the surfaces of the terminals 105 and the ACF 113 and decreases the reliability of the electric connection.

In addition, such a problem is caused on a terminal connection for electronic devices other than the HDD for which the terminal connection structure connects between the tail connection 101 of the head suspension and the board connection 103 of the main flexible wiring board on the main body of the HDD.

SUMMARY OF THE INVENTION

An object of the present invention is to provide a terminal connection structure, capable of maintaining a degree of contact between surfaces of terminals and an anisotropic conductive film to secure a reliability of an electric connection even if the terminals are arranged with a high density.

In order to accomplish the object, an aspect of the present invention provides a terminal connection structure that includes a first connection and a second connection conductively connected to each other through an anisotropic conductive film. At least, one of the first and second connections has a base insulating layer, a cover insulating layer, a wiring pattern formed between the base and cover insulating layers, terminals arranged side by side at an end of the wiring pattern to expose outside the cover insulating layer and contact with the anisotropic conductive film, and a support portion protruding relative to a part of the base insulating layer in a surrounding area of a respective one of the terminals, to have a supporting face positioned at a protruding position relative to a top face of said part of the base insulating layer, the supporting face on which said respective one of the terminals is supported.

According to the aspect, each one terminal is arranged on the supporting face of said respective one of the terminals, the supporting face protruding from the surface of said part of the base insulating layer. This configuration easily maintains a degree of contact between a surface of the terminal and the anisotropic conductive film even if the terminals are arranged with a high density, thereby to maintain and enhance reliability of an electric connection.

DETAILED DESCRIPTION OF EMBODIMENTS

Embodiments according to the present invention will be explained. Each embodiment is capable of maintaining a degree of contact between surfaces of terminals and an anisotropic conductive film (hereinafter referred to as "ACF") to secure a reliability of an electric connection even if the terminals are arranged with a high density.

For this, a terminal connection structure of each one embodiment includes a first connection and a second connection connected to each other through the ACE. At least one of the first and second connections has a base insulating layer, a cover insulating layer, a wiring pattern formed between the base and cover insulating layers, terminals arranged side by side at an end of the wiring pattern to expose outside the cover insulating layer and contact with the anisotropic conductive film, and a support portion protruding relative to a part of the base insulating layer in a surrounding area of a respective one of the terminals, to have a supporting face positioned at a protruding position relative to a top face of said part of the base insulating layer, the supporting face on which said respective one of the terminals is supported.

The terminal connection structure is applicable to a terminal connection for electronic devices. For example, the terminal connection structure is applied to a connection between wiring of a bead suspension and a wiring board on a main body of a hard disk drive. In this case, the first connection is a tail connection of wiring of a flexure of the head suspension, and the second connection is a board side connection of the wiring board on the main body of the hard disk drive.

The support portion adjusts a protruding height of the terminal according to a protruding height of the support portion.

In a preferred embodiment, the support portion pots a surface of said respective one of the terminals on the same level with or above a surface of the cover insulating layer.

In a further preferred embodiment, said part of the base insulating layer is thinned so that the support portion protrudes relative to said part of the base insulating layer. In this case, a part of the wiring pattern is preferably located on said thinned part of the base insulating layer.

Hereinafter, the embodiments of the present invention will be explained in detail with reference to drawings.

Figure 1:
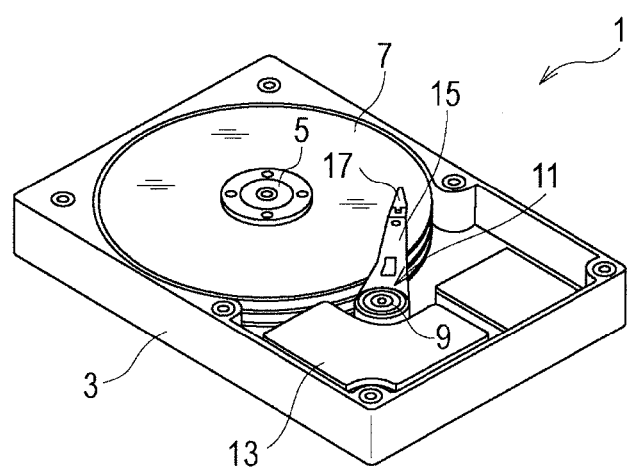
FIG. 1 is a perspective view illustrating a hard disk drive according to a first embodiment of the present invention.

FIG. 1 is a perspective view illustrating a hard disk drive according to a first embodiment of the present invention.

As illustrated in FIG. 1, the hard disk drive 1 (hereinafter referred to as "HDD") has in a case 3 disks 7 rotatable around a spindle 5, a carriage 11 turnable around a pivot shaft 9, a positioning motor 13 for driving the carriage 11 and the like. The case 3 is sealed by a lid (not illustrated).

The carriage 11 is provided with a plurality of arms 15. To a front end of each arm 15, a head suspension 17 is attached. The head suspension 17 is provided with a slider (not illustrated) that configures a magnetic head at a front end of the head suspension.

The head suspension 17 turns in a radius direction of the disk 7 by turning the carriage 11 with the positioning motor 13. With this turn of the head suspension 17, the slider moves to a given track on the disk 7.

The slider slightly floats from the disk 7 due to an air bearing formed between the slider and the disk 7 when the disk 7 rotates at high speed.

The slider or magnetic head is provided with elements such as MR (Magnetic Resistance) elements that convert between an electric signal and a magnetic signal. With these elements, the magnetic head accesses the disk 7 to read and write data to and from the disk 7.

Figure 2:
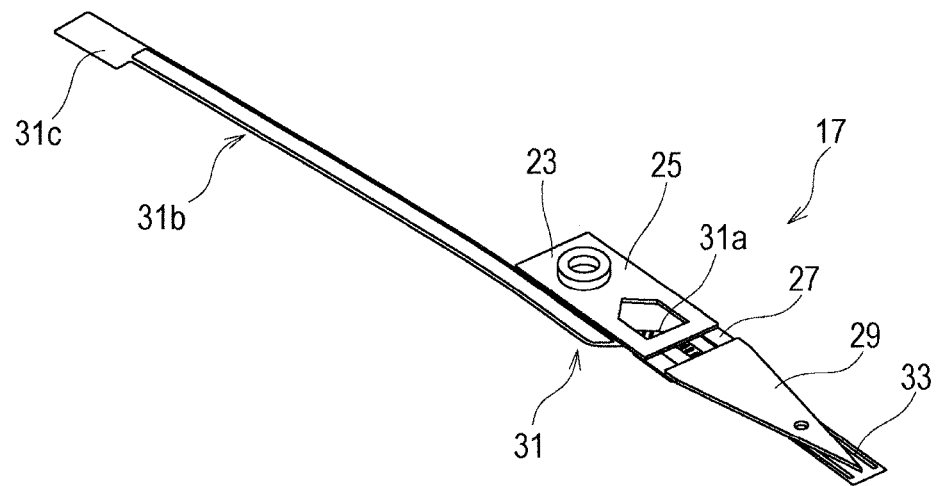
FIG. 2 is a perspective view illustrating a head suspension of the hard disk drive of FIG. 1.

FIG. 2 is a perspective view illustrating the head suspension 17.

The head suspension 17 is provided with a base part 25 including a base plate 23, a hinge part 27, a load beam 29, and a flexure 31 with wiring or conductors. Hereinafter, the flexure 31 with the wiring or conductors are simply referred to as the "flexure 31".

The base part 25 is fixed to the arm 15 of the carriage 11 and the load beam 29 is supported with the base part 25 through the hinge part 27. To the load beam 29, the flexure 31 is attached.

The flexure 31 is arranged along the load beam 29. A longitudinal part 31a of the flexure 31 overlapping the load beam 29 is fixed to the load beam 29 by a fixing means such as laser welding. The part 31a partly appears on FIG. 2. The flexure 31 has a tongue 33 that is formed on a front end of the flexure 31 and serves as a gimbal. The slider is attached on the tongue 33 so that the head suspension 17 and the slider form a bead gimbal assembly.

The flexure 31 has wiring traces 43 as the wiring or conductors (explained later with reference to FIGS. 3 and 4).

Through the wiring traces 43, the slider at the front end of the flexure 31 is connected to a main body of the HDD at a tail portion 31*b* of the flexure 31 opposite to the front end. The tail portion 31*b* extends rearward relative to the base part 25 toward the arm 15 of the carriage 11. A rear end of the tail portion 31*b* is provided with a tail connection 31*c*.

Figure 3:
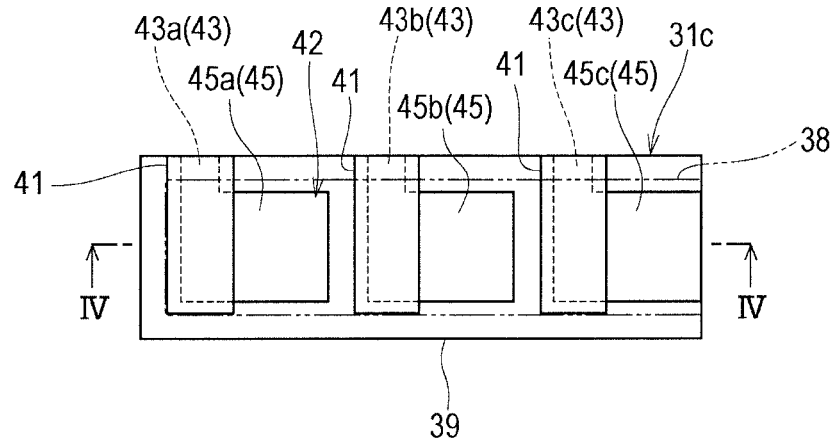
FIG. 3 is a plan view partly illustrating a terminal connection structure applied to a tail portion of a flexure of the head suspension of FIG. 2 with absence of a board side connection.
Figure 4:
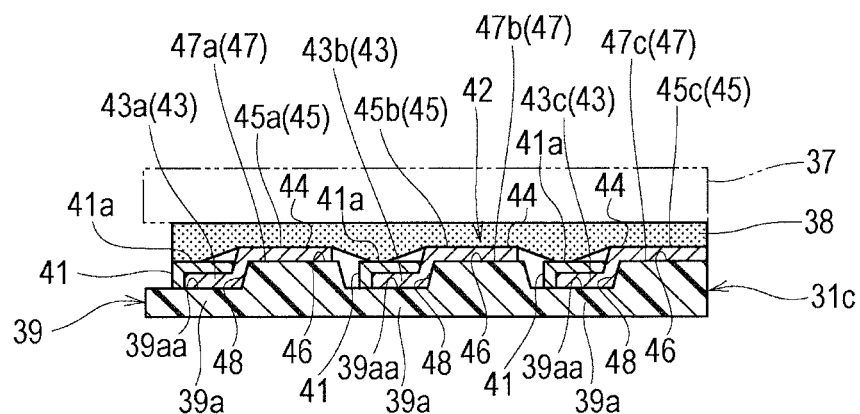
FIG. 4 is a sectional view taken along a line IV-IV of FIG. 3 with the board side connection represented with a chain double-dashed line.

The tail connection 31*c* is conductively connected to a board side connection 37 of a wiring board (not illustrated) on the main body side of the HDD 1 through, the ACF 38 (FIGS. 3 and 4).

FIG. 3 is a plan view partly illustrating a terminal connection structure applied to the tail portion 31*a* of the flexure 31 of the head suspension 17 with absence of the board side connection 37 on the main body of the HDD 1. FIG. 4 is a sectional view taken along a line IV-IV of FIG. 3 with the board side connection 37 represented with a chain double-dashed line. In the following explanation, a vertical or height direction is in a direction along a turning axis of the head suspension 17.

The terminal connection structure of FIGS. 3 and 4 conductively connects the tail connection 31*c* serving as the first connection to the board side connection 37 serving as the second connection through the ACF 38. As mentioned above, the tail connection 31*c* is the component of the flexure 31 of the head suspension 17, and the board side connection 37 is the component of the wiring board on the main body side of the HDD 1.

As illustrated in FIGS. 3 and 4, the flexure 31 mainly illustrated in FIG. 2 has a metal thin plate such as stainless steel plate (not illustrated), a base insulating layer 39 made of resin plate such as polyimide plate and laminated on the metal thin plate, a wiring pattern 42 made of conductive material such as copper and laminated on the base insulating layer 39, and a cover insulating layer 41 made of resin such as polyimide and covering over the wiring pattern 42.

In the tail connection 31*c*, the metal thin plate is removed or omitted and the flexure 31 has the base insulating layer 39, the cover insulating layer 41, and the wiring pattern 42 formed between the base and cover insulating layers 39 and 41. In the tail connection 31*c*, the flexure 31 may have the metal thin plate.

The wiring pattern 42 on the tail connection 31*c* includes wiring traces 43*a*, 43*b*, 43*c* . . . and terminals 45*a*, 45*b*, 45*c* . . . The wiring traces 43*a*, 43*b*, 43*c* . . . and the terminals 45*a*, 45*b*, 45*c* . . . are also referred to generically as the wiring traces 43 and terminals 45. In FIGS. 3 and 4, the tail connection 31*c* is partly illustrated and has the three wiring traces 43 and the three terminals 45. Actually, the eight to ten wiring traces 43 and terminals 45 are formed on the tail connection 31*c*. The number of wiring traces 43 and terminals 45, however, are optional. A surface of the wiring pattern 42 is plated with gold.

The wiring traces 43*a*, 43*b*, 43*c* . . . of the wiring pattern 42 are led to the respective terminals 45*a*, 45*b*, 45*c* . . . on the tail connection 31*c*. The terminals 45*a*, 45*b*, 45*c* . . . orthogonally protrudes from the respective wiring traces 43*a*, 43*b*, 43*c* . . . in the plan view and are arranged side by side in the protruding direction of the terminals. These terminals 45*a*, 45*b*, 45*c* . . . are supported on support portions 47*a*, 47*b*, 47*c* . . . , respectively. The support portions 47*a*, 47*b*, 47*c* . . . are also referred to generically as the support portions 47.

Each one support portion 47 protrudes upward relative to a part 39*a* of the base insulating layer 39 located in a surrounding area of the corresponding terminal 45. The surrounding area of the terminal 45 means at least a surrounding area of a connecting face 44 of the terminal 45. The connecting face 44 is a top face of the terminal 45 to be in contact with the ACF 38.

According to the embodiment, a protruding height of the support portion 47 relative to the part 39*a* is equivalent to a height of the cover insulating layer 41 relative to the part 39*a*. Namely, a top face or surface 46 of the support portion 47 is on the same level with a top face 41*a* of the cover insulating layer 41 on the part 39*a*.

The protruding height of the support portion 47 determines a height tor a protruding position of the elevated terminal 45 relative to the part 39*a* of the base insulating layer 39 i.e. the cover insulating layer 41. The protruding height of the support portion 47, therefore, may be adjusted in view of a relationship between the positions of the terminal 45 and the part 39*a* or the cover insulating layer 41 as necessary. In some cases, the top face 46 of the support portion 47 may be positioned lower or upper than the top face 41*a* of the cover insulating layer 41.

The top free 46 of the support portion 47 is flat, and peripheral faces 48 of the support portion 47 extend from an outer periphery of the top face 46 to the part 39*a* of the base insulating layer 39. The peripheral faces 48 are inclined to gradually enlarge a cross sectional shape of the support portion 47 toward the base insulating layer 39. With this, the support portion 47 is shaped into a trapezoidal cross section.

The top face 46 of the support portion 47 serves as a supporting face at a protruding position relative to a top face or surface 39*aa* of the part 39*a* of the base insulating layer 39, the top face 46 on which the terminal 45 is supported. The support portion 47, therefore, elevates the connecting face 44 of the terminal 45 relative to the top face 39*aa* of the part 39*a* of the base insulating layer 39 located in the surrounding area of the connecting face 44.

According to the embodiment, the terminal 45 has a protruding height relative to the part 39*a* of the base insulating layer 39 greater than the protruding height of the cover insulating layer 41. Namely, the connecting face 44 of the terminal 45 is elevated above the top face 41*a* of the cover insulating layer 41.

Figure 12A:
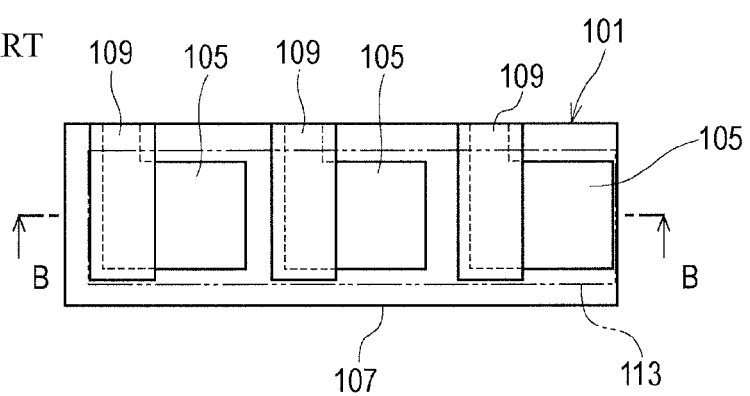
FIG. 12A is a plan view partly illustrating a connection structure applied to a tail portion of wiring of a head suspension according to the related art with absence of a board side connection.
Figure 12B:
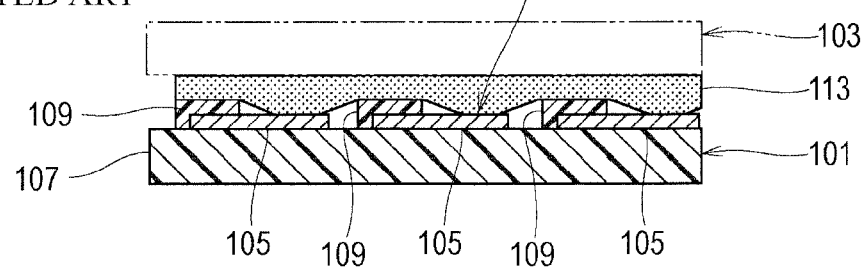
FIG. 12B is a sectional view taken along a line XIIB-XIIB of FIG. 12A with the board side connection represented with a chain double-dashed line.

The support portion 47, however, only has to protrude from the part 39*a* of the base insulating layer 39 in order to improve a degree of contact between the terminal 45 and the ACF 38 by comparison with an example of FIG. 12 as explained in detail later. In this configuration, the protruding height of the terminal 45 may be equivalent to or shorter than the protruding height of the cover insulating layer 41 so that the connecting face 44 of the terminal 45 is positioned on the same level with or lower than the top face 41*a* of the cover insulating layer 41.

The part 39*a* of the base insulating layer 39 is formed by partly thinning the base insulating layer 39. With the thinned part 39*a* of the base insulating layer 39, the support portion 47 relatively protrudes from the part 39*a* of the base insulating layer 39 in the surrounding area.

The formation of the part 39*a* of the base insulating layer 39 is carried out by any method so as to form a level difference between the support portion 47 and the part 39*a* of the base insulating layer 39. For example, the part 39*a* is formed by etching or exposure of a gradational or photosensitive resin.

If the base insulating layer 39 is made of a gradational or photosensitive polyimide (gradational or photosensitive resin), a precursor is developed while differentiating exposure amounts of parts of the precursor corresponding to the support portion 47 and the part 39*a* of the base insulating layer 39 regardless of negative and positive types. If the base insulating layer 39 is made of a non-gradational or photosensitive polyimide (non-gradational or photosensitive resin), the base insulating layer 39 is formed to have a uniform thickness and then is partly etched.

The level difference between the support portion 47 and the part 39a of the base insulating layer 39 may be formed together with the other required level difference on the base insulating layer 39. In this case, the number of process is not increased, so that the support portion 47 is formed without cost increase.

The cover insulating layer 41 covers the wiring pattern 42 of the flexure 31. In particular, the cover insulating layer 41 has parts spreading into the surrounding area of the respective terminals 45, to cover the wiring traces 43 of the wiring pattern 42 and not to cover the terminals 45. With this configuration, the terminals 45 expose outside the cover insulating layer 41.

Figure 5:
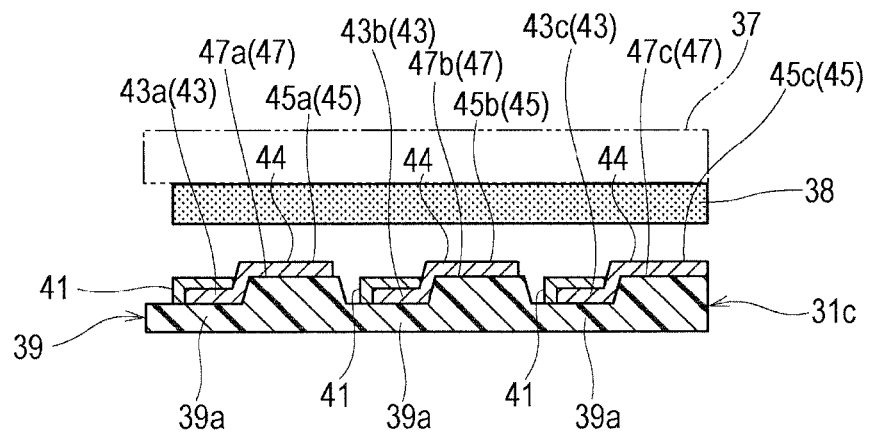
FIG. 5 is a sectional view illustrating the terminal connection structure corresponding to that of FIG. 4 before pressure contact.

FIG. 5 is a sectional view illustrating the terminal connection structure corresponding to that of FIG. 4 before pressure connection.

As illustrated in FIG. 5, the board side connection 37 and the tail connection 31c are positioned to face each other through the ACF 38 that is attached to the board side connection 37 in advance. Then, the board side connection 37 and the tail connection 31c are pressed to and contacted with each other through the ACF 38. With this pressure contact, the tail connection 31c and the board side connection 37 are connected to each other through the ACF 38.

At the time of the pressure contact, the ACF 38 on the board side connection 37 comes into contact with the contacting faces 44 of the terminals 45 in the beginning prior to the top face 41a of the cover insulating layer 41. The ACF 38 is aggressively compressed between the terminals 45 of the tail connection 31c and terminals of the board connection 37 with progression of the pressure contact. At this time, the ACF 38 secures conductivity at the compressed portions so that the terminals 45 of the tail connection 31c and the terminals of the board connection 37 are conductively connected to each other through the compressed portions of the ACF 38.

In the completion of the pressure connection, the ACF 38 is also in contact with the top face 41a of the cover insulating layer 41 as illustrated in FIG. 4. Each one terminal 45, however, upwardly protrudes toward the ACF 38 with respect to the cover insulating layer 41. With this, each one terminal 45 is stably connected to the ACF 38.

As explained above, the terminal connection structure according to the first embodiment conductively connects the tail connection 31c as the first connection to the board side connection 37 on the main body of the HDD 1 as the second connection through the ACF 38. The tail connection 31c comprises the base insulating layer 39, the cover insulating layer 41, the wiring pattern 42 formed between the base and cover insulating layers 39 and 41, the terminals 45 arranged side by side at the end of the wiring pattern 42 to expose outside the cover insulating layer 41 and contact with the ACF 38, and the support portion 47 protruding relative to the part 39a of the base insulating layer 39 in the surrounding area of the respective one of the terminals 45, to have the top face 46 as the supporting face positioned at the protruding position relative to the top face 39aa of the part 39a of the base insulating layer 39, the support face on which said respective one of the terminals 45 is supported.

The terminals 45, therefore, are elevated toward the ACF 38 and are stably connected to the ACF 38. Accordingly, even if the terminals 45 are arranged with the high density, the terminal connection structure secures the high degree of contact between the contacting faces 44 of the terminals 45 and the ACF 38 to maintain and enhance the reliability of the electric connection.

Further, the ACF 38 is aggressively compressed between the terminals 45 on the tail connection 31c and the terminals on the board side connection 37, respectively. This secures the conductive connection between the terminals 45 on the tail connection 31c and the terminals on the board side connection 37 through the ACF 38, thereby to maintain and enhance the reliability of the electric connection in this respect.

The support portion 47 puts the connecting face 44 of the respective one terminal 45 on the same level with or above the top face 41a of the cover insulating layer 41. This allows the ACF 38 to come into contact with the terminals 45 prior to the cover insulating layer 41, thereby to secure the high degree of contact between the terminals 45 on the tail connection 31c and the ACF 38. This configuration further securely maintains and enhances the reliability of the electric connection. At the same time, the ACF 38 is strongly compressed by the terminals 45, to further securely maintain and enhance the reliability of the electric connection.

The part 39a of the base insulating layer 39 is thinned so that the support portion 47 protrudes relative to the part 39a of the base insulating layer 39. The support portion 47, therefore, is formed without increase of the thickness of the tail connection 31c to keep the terminal connection structure compact.

Figure 6A:
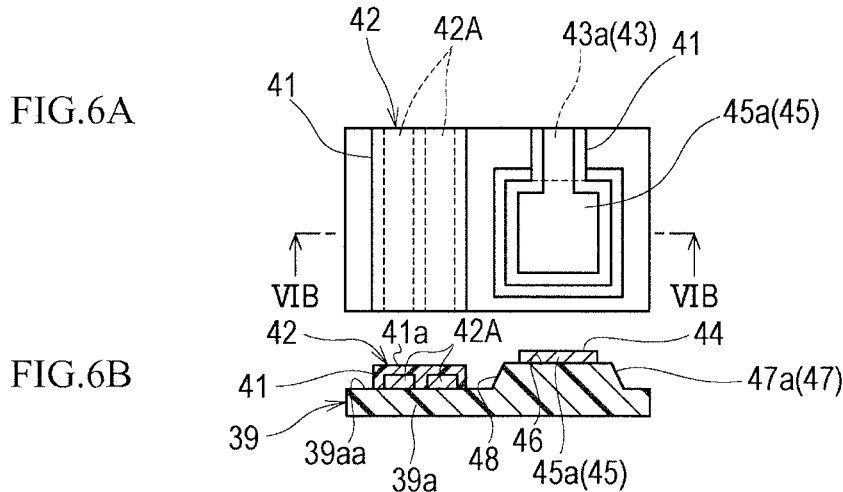
FIG. 6A is a plan view partly illustrating a tail connection of a terminal connection structure according to a modification of the first embodiment.
Figure 6B:
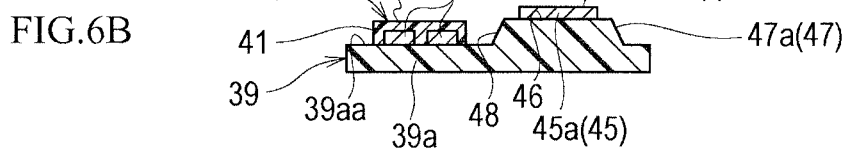
FIG. 6B is a sectional view taken along a line VIB-VIB of FIG. 6A.
Figure 7A:
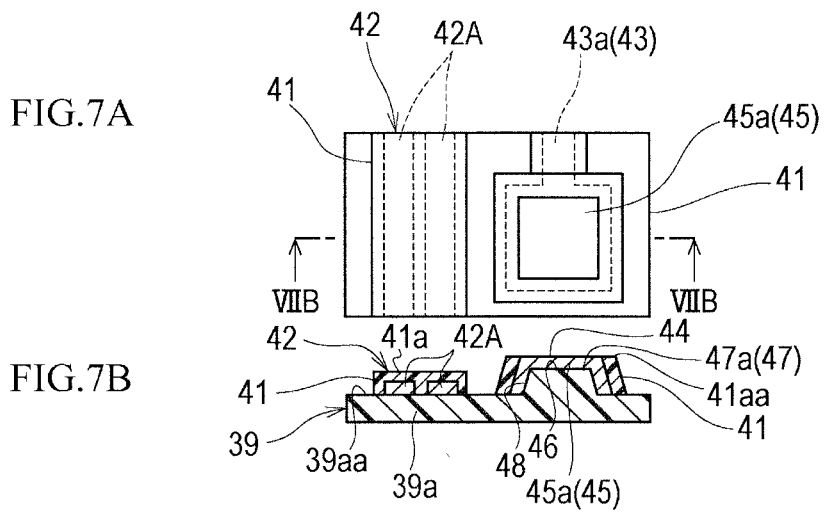
FIG. 7A is a plan view partly illustrating a tail connection of a terminal connection structure according to another modification of the first embodiment.
Figure 7B:
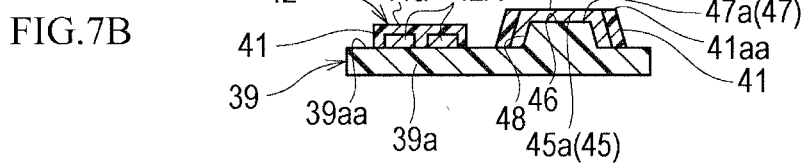
FIG. 7B is a sectional view taken along a line VIIB-VIIB of FIG. 7A.
Figure 8A:
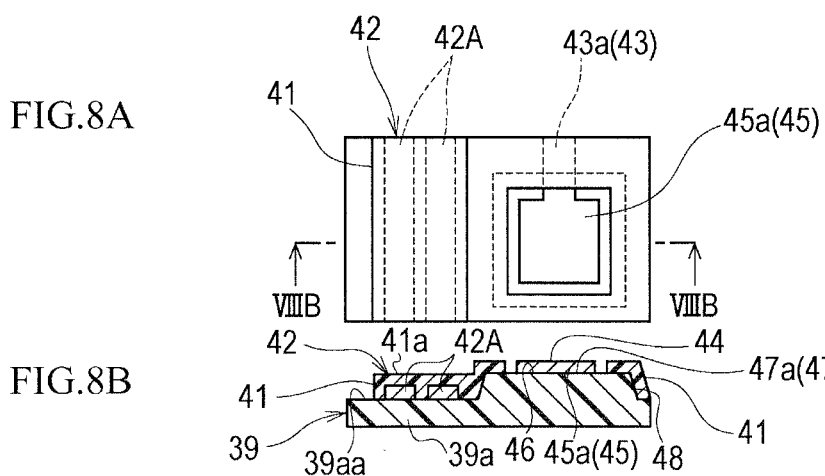
FIG. 8A is a plan view partly illustrating a tail connection of a terminal connection structure according to still another modification of the first embodiment.
Figure 8B:
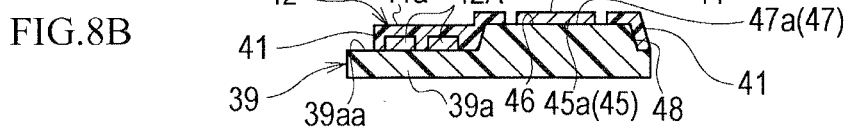
FIG. 8B is a sectional view taken along a line VIIIB-VIIIB of FIG. 8A.

Modifications according to the first embodiment will be explained with reference to FIGS. 6A to 8B. FIG. 6A is a plan view partly illustrating a tail connection of a terminal connection structure according to a modification of the first embodiment, and FIG. 6B is a sectional view taken along a line VIB-VIB of FIG. 6A. FIG. 7A is a plan view partly illustrating a tail connection of a terminal connection structure according to another modification of the first embodiment, and FIG. 7B is a sectional view taken along a line VIIB-VIIB of FIG. 7A. FIG. 8A is a plan view partly illustrating a tail connection of a terminal connection structure according to still another modification of the first embodiment, and FIG. 8B is a sectional view taken along a line VIIIB-VIIIB of FIG. 8A.

According to the modifications illustrated in FIGS. 6A to 8B, a part 42A of a wiring pattern 42 is arranged on a thinned part 39a of a base insulating layer 39. The part 42A of the wiring pattern 42 is a part of a wiring trace to be connected to, for example, another terminal adjacent to a terminal 45a on a tail connection 31c.

Further, the modifications of FIGS. 6A to 8B have different structures around support portions with respect to the aforementioned first embodiment. In FIGS. 6A to 8B, only one pair of the terminal 45a and the support portion 47a are represented. The other pairs of the terminal and the support portion are arranged in the vicinity of the one pair of the terminal 45a and the support portion 47a, but are not illustrated. In the following explanation, like the first embodiment, the wiring traces, terminals and support portions are referred to generically as the wiring traces 43, terminals 45 and support portions 47, respectively.

According to the modification of FIGS. 6A and 6B, the terminal 45 is arranged in line with the wiring trace 43 to protrude from the wiring trace 43 at each side in the plan view.

According to the modification of FIGS. 7A and 7B, the terminal 45 is arranged in line with the wiring trace 43. Further, this modification covers or coats peripheral faces 48 of the support portion 47 with the terminal 45. Portions of the terminal 45 on the peripheral faces 48 are covered or coated with a cover insulating layer 41 for covering the wiring trace 43 leading to the terminal 45 so that a contacting face 44 of the terminal 45 only exposes outside the cover insulating layer 41. An upper end face 41aa of the cover insulating layer 41 on the peripheral faces 48 is positioned on the same level with the contacting face 44 of the terminal 45.

The modification of FIGS. 7A and 7B allows an ACF 38 (not illustrated) to be in contact equivalently with the upper end face 41aa of the cover insulating layer 41 and the contacting face 44 of the terminal 45 that are positioned on the same level, to secure the high degree of the contact. Further, the cover insulating layer 41 protects a periphery of the terminal 45 to prevent the terminal 45 from be separated from the support portion 47.

According to the modification of FIGS. 8A and 8B, the terminal 45 is arranged in line with the wiring trace 43 like the modification FIGS. 7A and 7B. Further, a part of a cover insulating layer 41 reaches on a top face 46 of the support portion 47 to surround the terminal 45 while a rectangular inner periphery of the part of the cover insulating layer faces a rectangular outer periphery of the terminal 45 with a peripheral uniform gap in the plan view. The contacting face 44 of the terminal 45 is positioned on the same level with the top face 41a of the cover insulating layer 41 on the support portion 47.

The modification of FIGS. 8A and 8B allows an ACF 38 (not illustrated) to be in contact equivalently with the top face 41a of the cover insulating layer 41 and the contacting face 44 of the terminal 45 that are positioned on the same level, to secure the high degree of the contact. Further, the cover insulating layer 41 protects the outer periphery of the terminal 45 to prevent the terminal 45 from be separated from the support portion 47.

Figure 9:
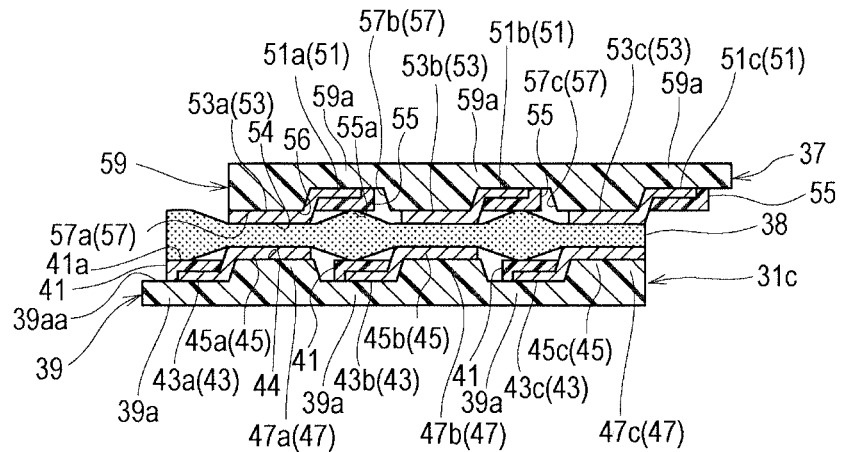
FIG. 9 is a sectional view illustrating a terminal connection structure according to a second embodiment of the present invention on a cutting plane corresponding to that of FIG. 4.

FIG. 9 is a sectional view illustrating a terminal connection structure according to the second embodiment of the present invention on a cutting plane corresponding to that of FIG. 4. The structure of the second embodiment is basically the same as that of the first embodiment and therefore the same components are represented with the same reference numerals to omit duplicate description.

According to the second embodiment, a board side connection 37 has the same structure as a tail connection 31c. The tail connection 1c according to the embodiment is the same as the tail connection 31c of the first embodiment illustrated in FIGS. 3-5.

The board side connection 37 has wiring traces 51 (51a, 51b, 51c . . . ), terminals 53 (53a, 53b, 53c . . . ), a cover insulating layer 55, support portions 57 (57a, 57b, 57c . . . ), and a base insulating layer 59 corresponding to wiring traces 43, terminals 45, a cover insulating layer 41, support portions 47, and a base insulating layer 39 of the tail connection 31c, respectively.

The terminals 53 are arranged side by side at ends of the wiring traces 51. The cover insulating layer 55 covers the wiring traces 51 and does not cover the terminals 53. The terminals 53, therefore, expose outside the cover insulating layer 55. The terminals 53 are supported on top faces 56 of the support portions 57, respectively. The support portions 57 protrude relative to the respective parts 59a of the base insulating layer 59 by thinning the parts 59a of the base insulating layer 59.

According to the embodiment, the ACF 38 is pinched or sandwiched by the board side connection 37 and the tail connection 31c so that the board side connection 37 and the tail connection 31c are pressed to and contacted with each other through the ACF 38.

At the time, the ACF 38 comes into contact with contacting faces 54 of the terminals 53 prior to the top face 55a of the cover insulating layer 55 on the board side connection 37 and contacting faces 44 of the terminals 45 prior to the top face 41a of the cover insulating layer 41 on the tail connection 31c. With this, the ACF 38 is aggressively compressed between the terminals 45 of the tail connection 31c and terminals 55 of the board connection 37 and conductively connects them to each other at the compressed portions.

The ACF 38, therefore, secures higher degree of contact to both the terminals 45 and 53 of the tail connection 31c and the board side connection 37 and is further compressed between the terminals 45 and 53, to electrically connect the terminals 45 and 53 to each other with a further certainty even if the terminals 45 and 53 are arranged with a high density.

In addition, the tail connection 31c and/or the board side connection 37 may employ the structure of any one of FIGS. 6A to 8B.

Figure 10:
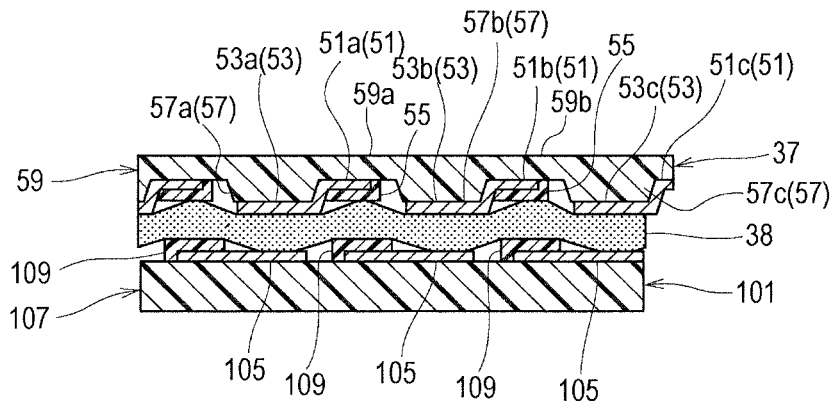
FIG. 10 is a sectional view illustrating a terminal connection structure according to a third embodiment of the present invention on a cutting plane corresponding to that of FIG. 4.
Figure 11A:
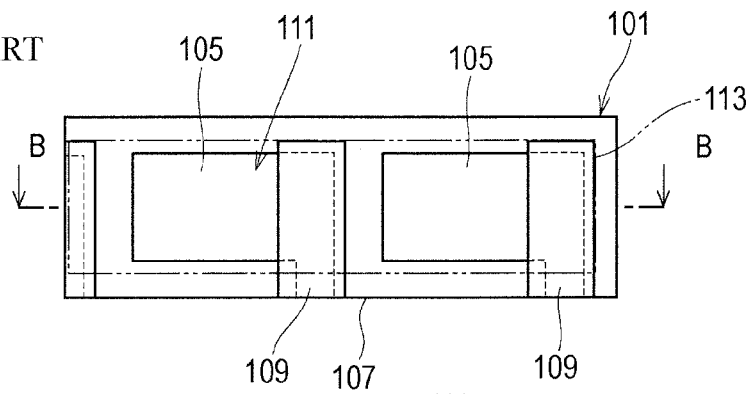
FIG. 11A is a plan view partly illustrating a connection structure applied to a tail portion of wiring of a head suspension according to the related art with absence of a board side connection.
Figure 11B:
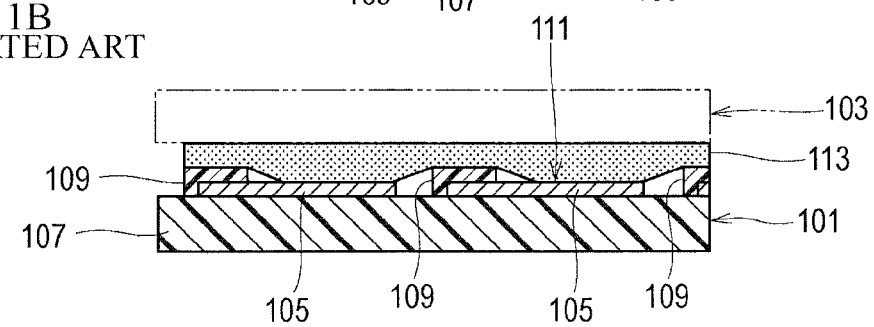
FIG. 11B is a sectional view taken along a line XIB-XIB of FIG. 11A with the board side connection represented with a chain double-dashed line.

FIG. 10 is a sectional view illustrating a terminal connection structure according to a third embodiment of the present invention on a cutting plane corresponding to that of FIG. 4. The structure of the second embodiment is basically the same as that of the first embodiment and therefore the same components are represented with the same reference numerals to omit duplicate description.

The terminal connection structure of FIG. 10 provides only a board side connection 37 with support portions 57 (57a, 57b, 57c . . . ). The board side connection 37 is the same as that of FIG. 9. To a tail connection 101, the structure of FIG. 12 is applied without change.

An ACF 38, therefore, secures high degree of contact to terminals 53 (553a, 53b, 53c. . . ) on the board side connection 37 and also terminals 105 on the tail connection 101, to electrically connect the terminals 53 and 105 to each other with a certainty even if the terminals 53 and 105 are arranged with a high density.

In addition, the board side connection 37 may employ the structure of any one of FIGS. 6A to 8B.

The structures in the embodiments are applicable not only to the terminal connection between the tail connection 31c or 105 and the board side connection 37, but to a terminal connection for the other electronic devices.

What is claimed is:

1. A terminal connection structure comprising:
   a first connection and a second connection conductively connected to each other through an anisotropic conductive film,
   wherein at least one of the first and second connections comprises
   a base insulating layer,
   a cover insulating layer,
   a wiring pattern formed between the base and cover insulating layers layers and having a wiring trace with a top face on which the cover insulating layer is layered,
   terminals arranged side by side at an end of the wiring pattern to expose outside the cover insulating layer and contact with the anisotropic conductive film, and
   a support portion protruding relative to a part of the base insulating layer in a surrounding area of a respective one of the terminals, to have a supporting face positioned at a first protruding position relative to a top face of said part of the base insulating layer in a protruding direction of the support portion, the supporting face on which said respective one of the terminals is supported, the support portion positioning a top face of said respective one of the terminals at a second protruding position elevated in the protruding direction relative to a portion of a top face of the cover insulating layer that is located over the wiring trace according to the first protruding position of the supporting surface.

2. The terminal connection structure of claim 1, wherein the first connection is a tail connection of wiring of a flexure of a head suspension, and
wherein the second connection is a board side connection of a wiring board on a main body of a hard disk drive.

3. The terminal connection structure of claim 1, wherein said part of the base insulating layer is thinned so that the support portion protrudes relative to said part of the base insulating layer.

4. The terminal connection structure of claim 3, wherein a part of the wiring pattern is located on said thinned part of the base insulating layer.

5. The terminal connection structure of claim 1, wherein the first protruding position of the supporting face is elevated relative to said portion of the top face of the cover insulating layer that is located over the wiring trace.

6. A terminal connection structure comprising:
a first connection and a second connection conductively connected to each other through an anisotropic conductive film,
wherein each one of the first and second connections comprises
a base insulating layer,
a cover insulating layer,
a wiring pattern formed between the base and cover insulating layers,
terminals arranged side by side at an end of the wiring pattern to expose outside the cover insulating layer, and
a support portion protruding relative to a part of the base insulating layer in a surrounding area of a respective one of the terminals, to have a supporting face positioned at a protruding position relative to a top face of said part of the base insulating layer, the supporting face on which said respective one of the terminals is supported.

* * * * *